US010311936B2

(12) United States Patent
Kang et al.

(10) Patent No.: US 10,311,936 B2
(45) Date of Patent: Jun. 4, 2019

(54) SEMICONDUCTOR MEMORY DEVICE MANAGING FLEXIBLE REFRESH SKIP AREA

(71) Applicant: Samsung Electronics Co., Ltd., Suwon-si, Gyeonggi-do (KR)

(72) Inventors: Uksong Kang, Seongnam-si (KR); Hoiju Chung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 470 days.

(21) Appl. No.: 15/233,942

(22) Filed: Aug. 10, 2016

(65) Prior Publication Data

US 2017/0047110 A1    Feb. 16, 2017

(30) Foreign Application Priority Data

Aug. 12, 2015    (KR) .................. 10-2015-0114009

(51) Int. Cl.
*G11C 11/406*    (2006.01)
*G11C 11/408*    (2006.01)

(52) U.S. Cl.
CPC ...... *G11C 11/40615* (2013.01); *G11C 11/406* (2013.01); *G11C 11/4087* (2013.01); *G11C 11/40622* (2013.01); *G11C 11/40626* (2013.01)

(58) Field of Classification Search
CPC ............ G11C 11/406; G11C 11/40615; G11C 11/40622; G11C 11/40626; G11C 11/4087
See application file for complete search history.

(56) References Cited

U.S. PATENT DOCUMENTS

| 6,208,577 | B1 | 3/2001 | Mullarkey |
| 6,650,587 | B2 | 11/2003 | Derner et al. |
| 6,925,016 | B2 | 8/2005 | Takahashi et al. |
| 7,088,635 | B2 | 8/2006 | Hur et al. |
| 7,149,140 | B2 | 12/2006 | Hur et al. |
| 7,193,919 | B2 | 3/2007 | Hoehler |
| 7,486,584 | B2 | 2/2009 | Kajigaya |
| 7,764,548 | B2 | 7/2010 | Sakakibara |
| 8,347,171 | B2 | 1/2013 | Seo |
| 9,286,965 | B2 * | 3/2016 | Perego .............. G11C 11/40603 |
| 9,640,242 | B1 * | 5/2017 | Lo ..................... G11C 11/40618 |
| 2003/0095459 | A1 | 5/2003 | Derner et al. |
| 2004/0080993 | A1 | 4/2004 | Takahashi et al. |
| 2005/0108460 | A1 | 5/2005 | David |
| 2005/0270874 | A1 | 12/2005 | Hur et al. |

(Continued)

FOREIGN PATENT DOCUMENTS

KR    20090126976 A    12/2009

*Primary Examiner* — Harry W Byrne
*Assistant Examiner* — R Lance Reidlinger
(74) *Attorney, Agent, or Firm* — Renaissance IP Law Group LLP

(57) ABSTRACT

A semiconductor memory device having a flexible refresh skip area includes a memory cell array including a plurality of rows to store data, a row decoder connected to the memory cell array, a refresh area storage unit to store a beginning address and an end address of a memory area that is to be refreshed in which the memory area that is to be refreshed does not include a refresh skip area having a size is selectively and/or adaptively changed, and a refresh control circuit connected to the row decoder and the refresh area storage unit. The refresh control circuit controls a refresh operation for the area that is to be refreshed and not for the refresh skip area.

20 Claims, 13 Drawing Sheets

(56) References Cited

U.S. PATENT DOCUMENTS

| | | |
|---|---|---|
| 2006/0087902 A1 | 4/2006 | Hoehler |
| 2006/0104139 A1 | 5/2006 | Hur et al. |
| 2008/0049532 A1 | 2/2008 | Kajigaya |
| 2009/0161456 A1 | 6/2009 | Sakakibara |
| 2011/0004805 A1 | 1/2011 | Seo |
| 2013/0100755 A1 | 4/2013 | Youn et al. |
| 2014/0025880 A1* | 1/2014 | Yu ..................... G11C 7/1072 711/105 |
| 2018/0053569 A1* | 2/2018 | Xiao ..................... G11C 11/406 |

* cited by examiner

FIG. 3

| | | | | | | | |
|---|---|---|---|---|---|---|---|
| | a8 | | c8 | | e8 | | g8 |
| | a7 | | c7 | | e7 | | g7 |
| | a6 | | c6 | | e6 | | g6 |
| A | a5 | C | c5 | E | e5 | G | g5 |
| | a4 | | c4 | | e4 | | g4 |
| | a3 | | c3 | | e3 | | g3 |
| | a2 | | c2 | | e2 | | g2 |
| | a1 | | c1 | | e1 | | g1 |

| | | | | | | | |
|---|---|---|---|---|---|---|---|
| | b8 | | d8 | | f8 | | h8 |
| | b7 | | d7 | | f7 | | h7 |
| | b6 | | d6 | | f6 | | h6 |
| B | b5 | D | d5 | F | f5 | H | h5 |
| | b4 | | d4 | | f4 | | h4 |
| | b3 | | d3 | | f3 | | h3 |
| | b2 | | d2 | | f2 | | h2 |
| | b1 | | d1 | | f1 | | h1 |

270

SEMICONDUCTOR MEMORY DEVICE MANAGING FLEXIBLE REFRESH SKIP AREA

CROSS-REFERENCE TO RELATED APPLICATION

This U.S. non-provisional patent application claims priority under 35 U.S.C. § 119 of Korean Patent Application No. 10-2015-0114009, filed on Aug. 12, 2015, the entire contents of which are hereby incorporated by reference.

BACKGROUND

The inventive concept relates to semiconductor memory devices, and more particularly, to a device that refreshes data of a volatile semiconductor memory device, such as a dynamic random access memory.

A volatile semiconductor memory device, such as a dynamic random access memory (DRAM), periodically performs a refresh operation to not lose data stored in memory cells of the DRAM. Typically there are two refresh operation modes for a DRAM—an auto-refresh operation mode and a self-refresh operation mode.

In an auto-refresh operation mode, a DRAM refreshes memory cells in response to an externally applied refresh command In a self-refresh operation mode, a DRAM internally and autonomously refreshes memory cells based on an operation of a refresh counter.

In the case in which a DRAM is used in a cellular phone, an application processor AP for a digital TV or a chip for a FRC (frame rate control), the DRAM may be used to provide a memory area for a frame buffer processing image data. Since image data is temporarily stored in the frame buffer memory area and a frame rate is faster than a refresh rate of the DRAM, image data stored in the frame buffer memory area does not need to become a target of a refresh operation.

A refresh operation of a memory area of a DRAM that is not used or in which data is not stored may also be skipped to reduce power consumption and/or increase performance.

SUMMARY

Embodiments of the inventive concept provide a semiconductor memory device. The semiconductor memory device includes a memory cell array including a plurality of rows to store data, a row decoder connected to the memory cell array, a refresh area storage unit to store a beginning address and an end address of a memory area of the memory cell array that is to be refreshed in which the memory area that is to be refreshed does not include a refresh skip area of the memory cell array that has a size is selectively and/or adaptively changed, and a refresh control circuit connected to the row decoder. The refresh control circuit may control a refresh operation for each row of the memory area that is to be refreshed and may control the refresh operation so that each row of the refresh skip area to not be refreshed.

In embodiments of the inventive concept, the refresh control circuit may control the refresh operation so that the refresh operation is not received by the refresh skip area during the refresh operation.

In embodiments of the inventive concept, the number of refresh commands generated for the memory area that is to be refreshed may be based on a temperature of the semiconductor device.

In embodiments of the inventive concept, the refresh control circuit may control a number of rows that are activated at the same time for the memory area that is to be refreshed is fewer than a number of rows that would be activated at the same time if there was no refresh skip area.

In embodiments of the inventive concept, the number of rows that are activated may be changed depending on a temperature of the semiconductor memory device.

In embodiments of the inventive concept, the refresh control circuit may control an entire refresh operation period to be shorter than an entire refresh operation period if there was no refresh skip area.

In embodiments of the inventive concept, a length of the entire refresh operation period may be based on a temperature of the semiconductor memory device.

In embodiments of the inventive concept, the refresh control circuit may include a refresh counter to count the refresh operation. A minimum counting value of the refresh counter may be set to a counting value corresponding to the beginning address of the memory area that is to be refreshed, and a maximum counting value of the refresh counter may be set to a counting value corresponding to the ending address of the memory area that is to be refreshed.

In embodiments of the inventive concept, the refresh control circuit may control the refresh control operation differently depending on whether the semiconductor memory device is in an auto-refresh operation mode or a self-refresh operation mode.

In embodiments of the inventive concept, the refresh area storage unit may comprise a mode register.

Embodiments of the inventive concept also provide a semiconductor memory device. The semiconductor memory device includes a memory cell array including a plurality of rows to store data, a row decoder connected to the memory cell array, a refresh area storage unit to store a beginning address and an end address of a memory area of the memory cell array that is to be refreshed in which the memory area that is to be refreshed does not include a refresh skip area of the memory cell array having a size is selectively and/or adaptively changed, and a refresh control circuit connected to the row decoder and the refresh area storage unit. The refresh skip area may include at least one row among the plurality of rows of the memory cell array that is used as at least a part of a frame buffer to store data during a time period that is shorter than a time period for the refresh operation.

In embodiments of the inventive concept, the refresh skip area may further include rows of the memory cell array that do not store data.

In embodiments of the inventive concept, the refresh area storage unit may comprise a mode register that stores mode register set signals.

In embodiments of the inventive concept, the beginning address and the ending address that are stored in the refresh area storage unit may be provided by a memory controller. In embodiments of the inventive concept, the refresh control circuit may include a refresh counter to count a refresh operation. A minimum counting value of the refresh counter may be set to a counting value corresponding to the beginning address of the memory area that is to be refreshed, and a maximum counting value of the refresh counter may be set to a counting value corresponding to the ending address of the memory area that is to be refreshed. The refresh control circuit may control a refresh control operation for each row of the memory area that is to be refreshed and may control the refresh operation of each row of the refresh skip area to not be refreshed.

Embodiments of the inventive concept provide a semiconductor memory device comprising a memory cell array to store data; and a refresh control circuit coupled to the semiconductor memory device in which the refresh control circuit is to control a refresh operation of a memory area of the memory cell array that is to be refreshed and in which the memory area that is to be refreshed does not include a refresh skip area of the memory cell array having a size that is selectively changeable based on data stored in the refresh skip area.

In embodiments of the inventive concept, the data stored the refresh skip area may comprise data for a frame buffer for a period of time that is less than a period of time of the refresh operation.

In embodiments of the inventive concept, the refresh skip area may contain no stored data.

In embodiments of the inventive concept, the memory cell array may comprise a plurality of rows to store the data, and the refresh control circuit may control a refresh operation for each row of the memory area that is to be refreshed and may control the refresh operation for each row of the refresh skip area to not be refreshed.

In embodiments of the inventive concept, the refresh control circuit may further control an interval of time between a refresh operation of each row of the memory area that is to be refreshed based on a temperature of the semiconductor device.

In embodiments of the inventive concept, the refresh control circuit may further control the interval of time between the refresh operation of each row of the memory area that is to be refreshed to increase as the temperature of the semiconductor device decreases.

In embodiments of the inventive concept, the refresh control circuit may further control the interval of time between the refresh operation of each row of the memory area that is to be refreshed to decrease as the temperature of the semiconductor device increases.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 3 is a drawing illustrating selective and adaptive refresh skip areas of memory banks of a memory cell array according to exemplary embodiments of the inventive concept.

DETAILED DESCRIPTION

Figure 1:
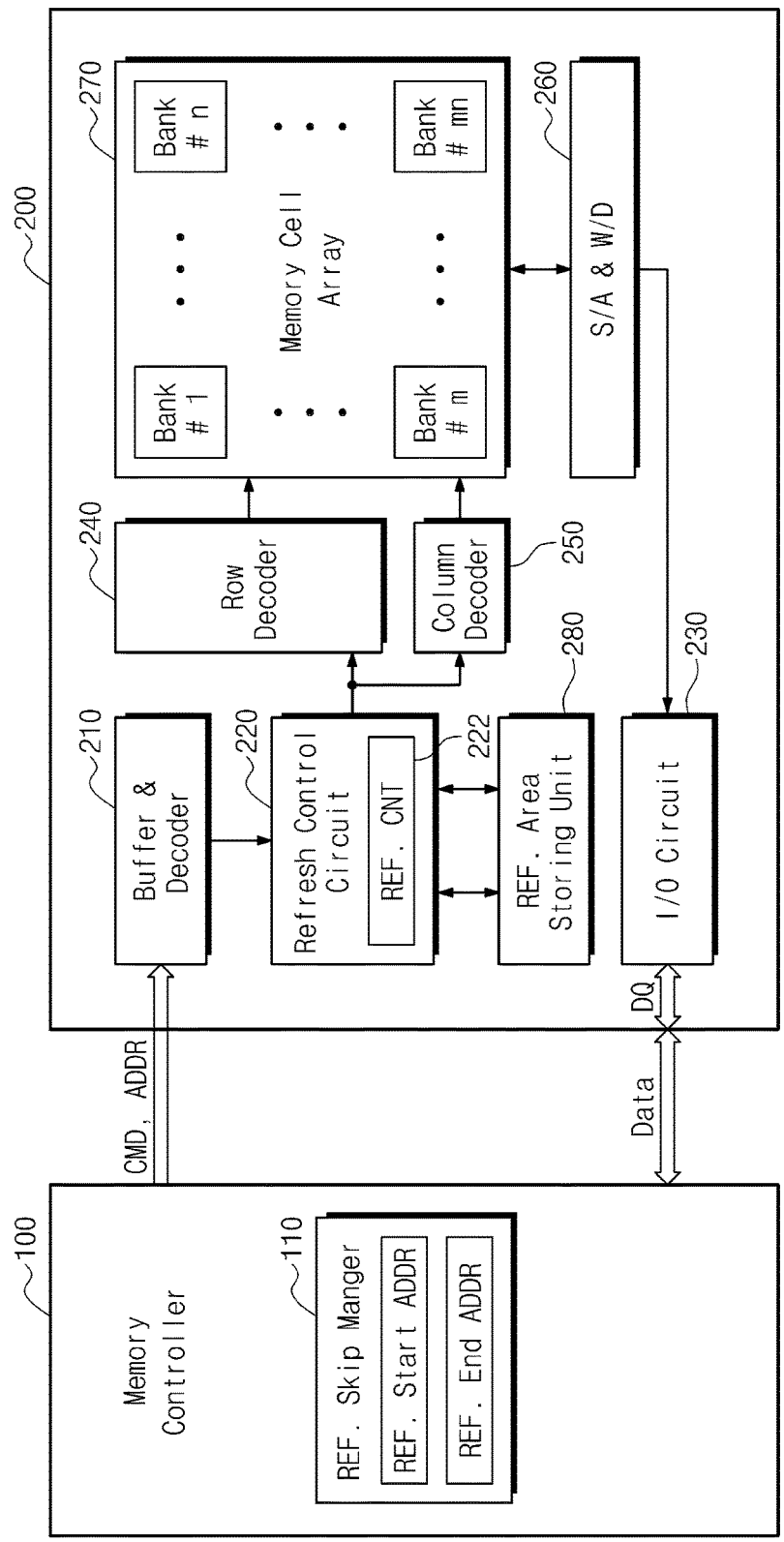
FIG. 1 is an illustrative block diagram of a memory system including a semiconductor memory device that manages a flexible refresh skip area according to exemplary embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first bank could be termed a second bank, and, similarly, a second bank could be termed a first bank without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may include, a refresh skip area having a size that is selectively and/or adaptively changed by a memory bank, a refresh area storage unit that stores a beginning address and an ending address of an area that is to be refreshed and a refresh control circuit connected to the refresh area storage unit. The refresh control circuit performs a refresh control operation that selectively refreshes a plurality of rows of an area of the memory bank that is to be refreshed, except for an area that is designated to be a refresh skip area.

In a case that at least one row of the plurality of rows of the memory bank is used as a frame buffer that stores data for a time period that is shorter than a given refresh operation period, the refresh control circuit designates the at least one row used as the frame buffer as the refresh skip area.

Volatile semiconductor memory devices may include a Dynamic Random Access Memory (DRAM), a synchronous DRAM, a double data rate DRAM (DDR-DRAM), or the like. For brevity and clarity, the disclosed embodiments of the inventive concept are described using circuit blocks that are briefly illustrated and described, but the inventive concept is not limited to the illustrated circuit blocks.

According to exemplary embodiments of the inventive concept, a memory bank that may selectively and/or adaptively change the size of a refresh skip area may improve refresh performance and reliability, and may reduce power consumption and power noises.

FIG. 1 is an illustrative block diagram of a memory system including a semiconductor memory device that manages a flexible refresh skip area according to exemplary embodiments of the inventive concept.

Referring to FIG. 1, a memory system may include a memory controller 100, such as an application processor, and a semiconductor memory device 200 that manages a flexible refresh skip area.

In the case that the memory system is part of a mobile device, the memory controller 100 may be a mobile AP driven in an operating system OS, such as, but not limited to, android, ios, window phone, blackberry, or Symbian. The memory device 200 may be a DRAM of DDR type.

The memory controller 100 can generate a command CMD and an address ADDR that is applied to the semiconductor device 200. The command CMD and the address ADDR may be provided separately through independent input pins to the semiconductor device 200 or may be provided together through command/address (CA) pins to the semiconductor device. The memory controller 100 can also apply data for writing to the semiconductor memory device 200.

The memory controller 100 may include a refresh skip manager 110 that generates a refresh beginning address and a refresh ending address with respect to a memory area that is to be refreshed except for a refresh skip area. The refresh skip manager 110 may be embodied by software, hardware, or a combination thereof.

The semiconductor memory device 200 may include a buffer & decoder 210, a refresh control circuit 220, an I/O circuit 230, a row decoder 240, a column decoder 250, an S/A & W/D 260, a memory cell array 270, and a refresh area storage unit 280.

The buffer & decoder 210 may receive and decode a command CMD and an address ADDR. For example, the buffer & decoder 210 may receive and decode a beginning address and an ending address for a memory area that is to be refreshed and receive and decode a refresh command A beginning address and an ending address of a memory area that is to be refreshed when a refresh command is received may be applied to the semiconductor memory device 200 in the memory controller 100 in an on-the-fly method. As used herein, the on-the-fly method means a method in which certain information is received and immediately or substantially immediately applied at a time when an operation is executed without being predetermined in advance of the time when the operation is executed.

The refresh area storage unit 280 may store a beginning address and an ending address of a memory area that is to be refreshed that accounts for a refresh skip area having a size that is selectively and/or adaptively changed by a memory bank. The refresh area storage unit 280 may be embodied by a mode register that stores a mode register set (MRS) signal. For example, in an auto-refresh operation mode, in the case that the refresh skip area having a size that is selectively and/or adaptively changed by a memory bank may be set by the memory controller 100, the beginning address and the ending address of the memory area that is to be refreshed and the refresh command may be applied to the buffer & decoder 210. The MRS signal may be provided when the semiconductor memory device is powered on or while an access operation of the semiconductor memory device is performed.

The memory cell array 270 may include a plurality of memory banks having refresh skip areas. In FIG. 1, the memory cell array 270 may be configured to include an n (in which n is a natural number of two or more) number of memory banks are disposed in a transverse direction (i.e., a horizontal direction in FIG. 1) and an m (in which m is a natural number of two or more) number of memory banks are disposed in a longitudinal direction (i.e., a vertical direction in FIG. 1). Each memory bank may include a plurality of pages for storing data. Here, the term "page" means a word line, and an opening (activation) of a page indicates that memory cells connected to a word line corresponding to the page are all accessed. For example, in a situation in which the number of memory cells connected to a word line is 1024, an opening of a page size means that the 1024 memory cells that are connected to the word line corresponding to the page are selected and accessed by a row address. In a situation in which a half page size is open, 512 memory cells connected to half of the selected word line are accessed.

The memory cell array 270 may include a main array area that includes normal memory cells for storing data, a dummy array area in which dummy memory cells for guaranteeing a normal operation of normal memory cells, and a redundancy area in which spare memory cells for defects of normal memory cells. The normal memory cells and the spare memory cells may have the same size and form. A DRAM memory cell may be formed by a storage capacity and an access transistor.

The access operation in the embodiments of the inventive concept may mean an operation of turning on an access transistor of a memory cell to read data from the memory cell or to write data in the memory cell. The open or opening operation, or the active operation mode, in the embodiments of the inventive concept may mean an operation of activating a page (or word line) of the memory cell array 270 that are selected by a row address.

The refresh control circuit 220 is connected to the buffer & decoder 210 and the refresh area storage unit 280. The refresh control circuit 220 may perform a refresh control operation on a selected number of rows of a memory bank that are to be refreshed, and exclude the refresh skip area from the refresh control operation.

The refresh control circuit 220 may generate a refresh command in which the refresh skip area is not refreshed when performing the refresh control operation. For example, in an auto-refresh operation mode, a refresh command may be received by the buffer & decoder 210 in which the refresh skip area is not to be refreshed. That is, the memory controller 100 may generate a refresh command in which the refresh skip area is not refreshed.

The refresh control circuit 220, if a refresh command is received or is generated in a refresh control operation, can cause the number of rows that are activated at the same time to be fewer than the number of rows that are activated at the same time in a situation in which there is no refresh skip area. For example, in the case in which the number of rows that are activated at the same time in the memory cell array 270 in a normal access operation (i.e., no refresh skip area) is eight (8), the number of rows that are activated at the same time in the memory cell array 270 by the refresh control circuit 220 if a refresh command is received or is generated and there is a refresh skip area may become four (4).

The refresh control circuit 220 may make the entire refresh operation period shorter if a refresh command is received or is generated than the entire refresh operation period if a refresh command is received and there is no refresh skip area.

The refresh control circuit 220 may include a refresh counter 222 to count a refresh operation. A minimum counting value of the refresh counter 222 may be set to a counting value corresponding to the beginning address of a refresh area, and a maximum counting value may be set to a counting value corresponding to the ending address of the refresh area.

The refresh control circuit 220 may perform a refresh control operation differently depending on whether the memory system is in an auto-refresh operation mode or a self-refresh operation mode. That is, refresh skip areas that are designated in an auto-refresh operation mode may be equal to or different from refresh skip areas that are designated in a self-refresh operation mode.

The refresh control circuit 220, in the case in which at least one of the rows is used as a frame buffer that stores data during a time period that is shorter than a given refresh operation time period, can designate the rows being used as the frame buffer to be a refresh skip area.

The refresh control circuit 220, in the case in which greater than a certain number of rows of the rows that do not store data, can designate the rows that do not store data as a refresh skip area. The refresh control circuit 220 performs a refresh control operation in which a refresh operation is selectively performed on the plurality of rows by the memory bank storing data and not on the rows of the refresh skip area. Accordingly, since a refresh operation for a memory array that includes a refresh skip area having a size that is selectively and/or adaptively changed by a memory bank, a refresh of the refresh skip area is skipped or not performed, refresh performance and/or reliability may be increased, and power consumption and/or power noise may be reduced.

Referring back to the memory system shown in FIG. 1, pages (rows or word lines) of the memory cell array 270 may be selected by the row decoder 240 and bit lines may be selected by the column decoder 250.

The row decoder 240 may decode a row address to activate a selected page (or word line) in a refresh operation mode. The column decoder 250 may decode a column address to select a bit line.

The S/A & W/D 260 may amplify data read from a memory cell, may provide the amplified data to the I/O circuit 230, and may drive write data that is received to write data in a selected memory cell.

The I/O circuit 230 may output read data to the memory controller 100 and may receive write data to provide the received write data to the S/A & W/D 260.

Although data being read from a selected memory cell in a refresh operation mode may be amplified by a sense amplifier, the amplified data may not output through the I/O circuit 230. That is, data being read may be amplified by the sense amplifier and then may be restored in the selected memory cell.

Figure 2:
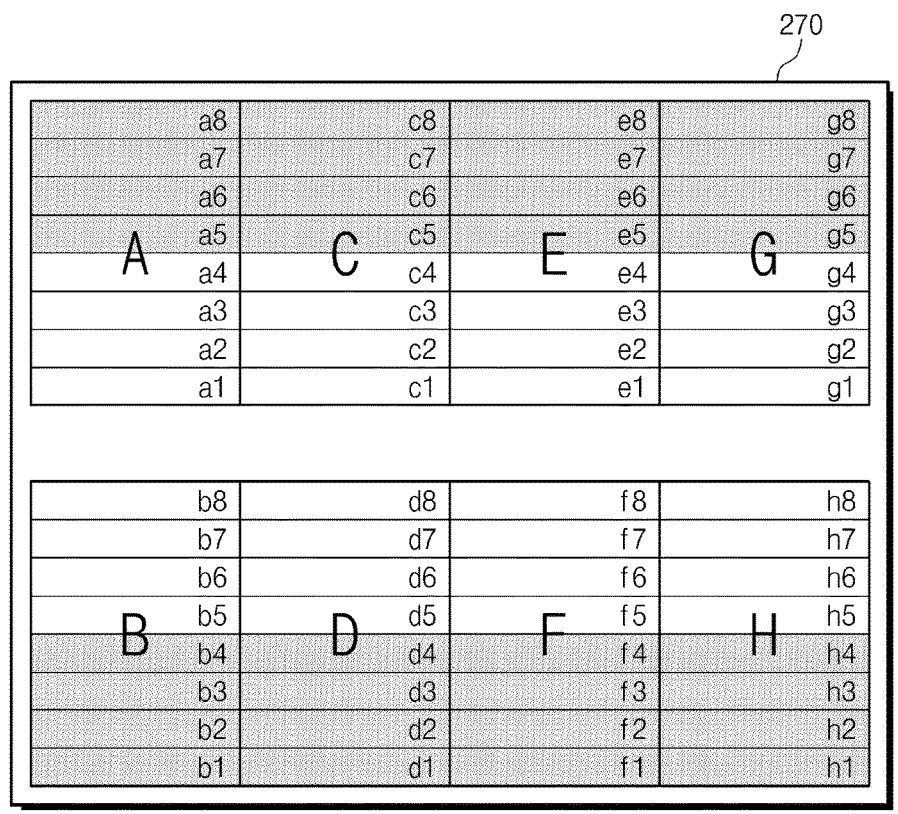
FIG. 2 is a drawing illustrating fixed refresh skip areas of memory banks of a memory cell array according to exemplary embodiments of the inventive concept.

FIG. 2 is a drawing illustrating fixed refresh skip areas of memory banks of a memory cell array according to exemplary embodiments of the inventive concept.

Referring to FIG. 2, an example of memory cell array 270 of FIG. 1 is shown that is formed by eight (8) memory banks (A, B, C, D, E, F, G, H), and in which each memory bank has corresponding refresh skip areas that are equivalently sized. That is, as shown in FIG. 2, areas of the respective memory banks of the memory cell array 270 that are shown in white are areas represent areas that are to be refreshed, whereas areas of the respective memory banks of the memory cell array 270 that are shown in gray represent areas that are refresh skip areas and are not to be refreshed.

More specifically, in the case of the memory bank A, areas (a1, a2, a3, a4) indicate an area that is to be refreshed, and areas (a5, a6, a7, a8) indicate a refresh skip area that is to be refresh-skipped. In the case of the memory bank C, areas (c1, c2, c3, c4) indicate an area that is to be refreshed, and areas (c5, c6, c7, c8) indicate a refresh skip area that is to be refresh-skipped.

In the case of the memory bank B, areas (b1, b2, b3, b4) indicate a refresh skip area, and areas (b5, b6, b7, b8) indicate an area that is to be refreshed. In the case of the memory bank D, areas (d1, d2, d3, d4) indicate a refresh skip area, and areas (d5, d6, d7, d8) indicate an area that is to be refreshed. Memory banks E-H have correspondingly similar areas that are to be refreshed and refresh skip areas.

Referring to the memory bank A in FIG. 2, if, for example, an address for refreshing the area a1 is designated as a beginning address, an address for refreshing the area a4 may be designated as an ending address. In this case, a counting value corresponding to the beginning address of the refresh counter 222 may be set to a minimum counting value, and a counting value corresponding to the ending address of the refresh counter 222 may be set to a maximum counting value.

In a case in which the respective refresh skip areas are set to be equal by the memory banks, the refresh control may become simple in comparison to a case in which the respective refresh skip areas are selectively and/or adaptively set by the memory banks.

FIG. 3 is a drawing illustrating selective and/or adaptive refresh skip areas of memory banks of a memory cell array according to exemplary embodiments of the inventive concept.

Referring to FIG. 3, an example that the memory cell array 270 of FIG. 1 is shown that is formed by eight (8) memory banks (A, B, C, D, E, F, G, H) in which each memory bank has differently sized refresh skip areas. Again, as shown in FIG. 3, areas of the respective memory banks of the memory cell array 270 that are shown in white are areas represent areas that are to be refreshed, whereas areas of the respective memory banks of the memory cell array 270 that are shown in gray represent areas that are refresh skip areas and are not to be refreshed.

That is, in the case of the memory bank A, areas (a1, a2, a3, a4) indicate an area that is to be refreshed, and areas (a5, a6, a7, a8) indicate a refresh skip area that is to be refresh-skipped. In the case of the memory bank C, areas (c1, c4, c5, c6, c7, c8) indicate an area that is to be refreshed, and areas (c2, c3) indicate a refresh skip area that is to be refresh-skipped.

In the case of the memory bank B, areas (b1, b2, b3) indicate a refresh skip area, and areas (b4, b5, b6, b7, b8) indicate an area that is to be refreshed. In the case of the memory bank D, areas (d7, d8) indicate a refresh skip area, and areas (d1, d2, d3, d4, d5, d6) indicate an area that is to be refreshed. Memory banks E-H have correspondingly similar areas that are to be refreshed and refresh skip areas.

Referring to the memory bank A in FIG. 3, if, for example, an address for refreshing the area a1 is called a beginning address, an address for refreshing the area a4 may be called an ending address. In this case, a counting value corresponding to the beginning address of the refresh counter 222 may be set to a minimum counting value and a counting value corresponding to the ending address of the refresh counter 222 may be set to a maximum counting value.

In a case in which the respective refresh skip areas are set differently by the memory banks, the refresh control may become complicated in comparison to with a case in which the respective refresh skip areas are set equally by the memory banks. However, advantages of performance may increase, in addition to providing a reduction of power consumption and power noise dispersion.

The refresh skip areas illustrated in FIGS. 2 and 3 may be set to be equal or selectively and/or adaptively set in an auto-refresh operation mode or in a self-refresh operation mode of a memory system. For example, if in the auto-refresh operation mode, the refresh skip areas are applied like depicted in FIG. 2, whereas in the self-refresh operation mode, the refresh skip areas may be applied like depicted in FIG. 3.

Figure 4:
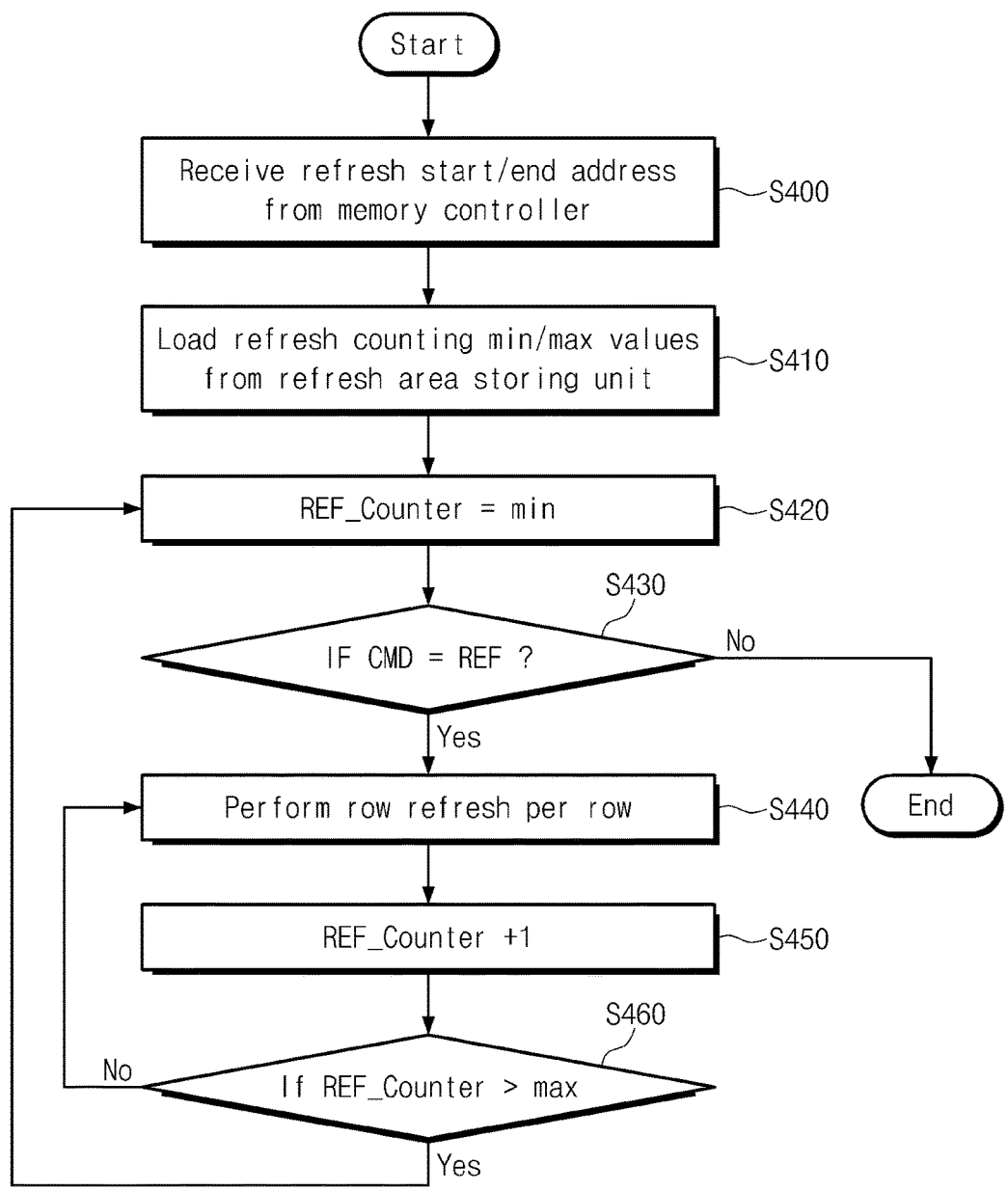
FIG. 4 is a refresh operation control flow diagram of the semiconductor memory device of FIG. 1 in an auto-refresh operation mode according to exemplary embodiments of the inventive concept.

FIG. 4 is a refresh operation control flow diagram of the semiconductor memory device of FIG. 1 in an auto-refresh operation mode according to exemplary embodiments of the inventive concept.

Referring to FIG. 4, in an operation S400, the semiconductor memory device 200 receives from the memory controller 100 a beginning address and an ending address for an area that is to be refreshed. The operation S400 may be performed in the case of an auto-refresh operation mode. The refresh beginning address and the refresh ending address of an area that is to be refreshed can be stored by a memory bank in the refresh area storage unit 280, which may be embodied by a mode register. Since the refresh beginning address and the refresh ending address is to exclude a refresh skip area having a size that may be selectively and/or adaptively changed by a memory bank, the corresponding size of a refresh area may be considered to be selectively and/or adaptively changed by the memory bank.

In an operation S410, the refresh control circuit 220 loads a minimum counting value and a maximum counting value of the refresh counter 222. Here, the minimum counting value of the refresh counter 222 may be set to a counting value corresponding to the beginning row address of the refresh area, and the maximum counting value of the refresh counter 222 may be set to a counting value corresponding to the ending row address of the refresh area.

The refresh counter 222 begins a refresh counting operation from the minimum counting value and ends the refresh counting operation at the maximum counting value.

In an operation S420, a counting value (REF_Counter) of the refresh counter 222 is set to the minimum counting value under the control of the refresh control circuit 220.

In an operation S430, if a refresh command (REF) is received, flow continues to an operation S440 where a refresh operation is performed by a row unit. If a refresh operation with respect to one row is finished, flow continues to an operation S450 where the counting value (REF_Counter) of the refresh counter 222 is incremented by 1.

In an operation S460, it is determined whether the incremented counting value (REF_Counter) is greater than the maximum counting value. If the increased counting value is less than or equal the maximum counting value, the flow returns to the operation S440 and a refresh operation for the next selected row is performed.

If, at operation S460, the incremented counting value is greater than the maximum counting value, flow returns to the operation S420 and a counting value (REF_Counter) of the refresh counter 220 is reset to the minimum counting value.

Thus, as shown by the refresh operation depicted in FIG. 4, a refresh operation is not performed and is skipped for a memory area designated as a refresh skip area. Moreover, although a refresh command may occur internally or externally, a refresh operation of activating word lines of the refresh skip area does not occur.

Figure 5:
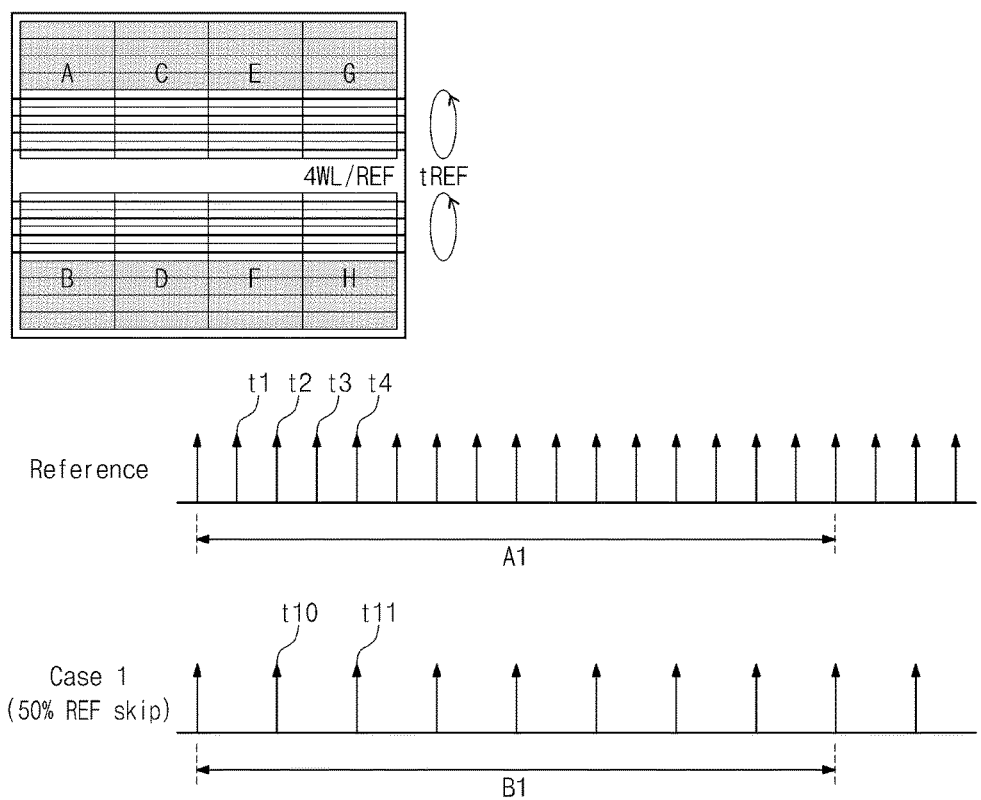
FIG. 5 is a drawing illustrating an example associated with a refresh skip operation of the semiconductor memory device of FIG. 1 according to exemplary embodiments of the inventive concept.

FIG. 5 is a drawing illustrating an example associated with a refresh skip operation of the semiconductor memory device of FIG. 1 according to exemplary embodiments of the inventive concept. As shown in FIG. 5, areas of the respective memory banks of the memory cell array that are shown in white represent areas that are to be refreshed, whereas areas of the respective memory banks of the memory cell array that are shown in gray represent areas that are refresh skip areas and are not to be refreshed.

Referring to FIG. 5, the refresh control circuit 220 does not generate a refresh command corresponding to the refresh skip area when performing a refresh control operation.

In this case, the refresh skip manager 110 of the memory controller 100 reduces the number of refresh commands that are generated by the number of refresh commands that would correspond to the refresh skip area. For example, if 5000 refresh commands per a bank are needed in an auto-refresh operation and the number of refresh commands corresponding to the refresh skip area is 2500, the refresh skip manager 110 skips the 2500 refresh commands corresponding to the refresh skip area and only generates 2500 refresh commands corresponding to the area that is to be refreshed. The generated 2500 refresh commands may be equally distributed within the entire given refresh time period.

Thus, referring to FIG. 5, in a case in which the refresh time periods A1 and B1, which respectively represent the entire refresh time tREF for the Reference and the entire refresh time of a Case 1, are equal to each other, a refresh interval in the Case 1 may be twice as long as compared to a refresh interval in a Reference. Here, the Reference refers to a situation in which a memory bank does not have a refresh skip area and the entire memory bank is refreshed.

If, in the Case 1, a designated refresh skip area is 50% in a memory bank, the number of occurrences of refresh commands is reduced by 50%, and the number of times refresh operations are performed in the entire refresh time tREF is also reduced by 50%. In FIG. 5, a time t10 of the Case 1 is equal to a time t2 of the Reference, and a time t11 of the Case 1 is equal to a time t4 of the Reference. That is, while a refresh operation is performed four times in the Reference, a refresh operation is performed twice in the Case 1.

In a self-refresh operation mode, the refresh control circuit 220 may autonomously reduce refresh operation control by 50%.

In the Case 1, the number of word lines activated at the same time may be maintained at the same level as the case of the Reference.

Like the Case 1, if reducing the number of refresh commands by the number of commands corresponding to the refresh skip area to generate a reduced number of refresh commands and distributing the generated refresh commands equally over time, the number of refresh operations is reduced by 50%. Thus, since a read or write operation may be further performed during the time of the 50% reduced refresh operations, operational performance of the memory system may be improved, and reduced a power consumption and noise dispersion may be obtained.

Figure 6:
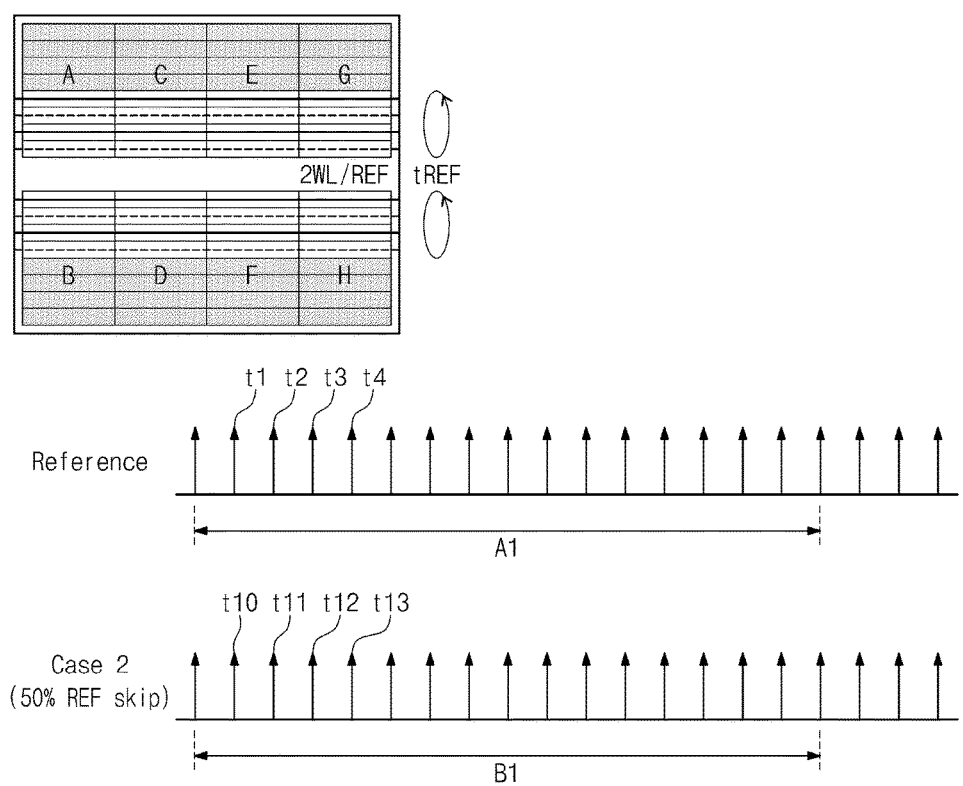
FIG. 6 is a drawing illustrating another example associated with a refresh skip operation of the semiconductor memory device of FIG. 1 according to exemplary embodiments of the inventive concept.

FIG. 6 is a drawing illustrating another example associated with a refresh skip operation of the semiconductor memory device of FIG. 1 according to exemplary embodiments of the inventive concept. As shown in FIG. 6, areas of the respective memory banks of the memory cell array that are shown in white represent areas that are to be refreshed, whereas areas of the respective memory banks of the memory cell array that are shown in gray represent areas that are refresh skip areas and are not to be refreshed.

Referring to FIG. 6, the refresh control circuit 220, when a refresh command with respect to the refresh skip area is received or generated in a refresh control operation, can reduce the number of rows that are activated at the same time with respect to an area that is to be refreshed fewer than the number of rows that are activated at the same time in the situation in which there is no refresh skip area.

In a Case 2 of FIG. 6, since a refresh operation with respect to the refresh skip area is not performed, but a command with respect to the refresh skip area occurs, the number of external refresh commands that are applied is not reduced in comparison to a Reference case. When a refresh command is received or generated in response to the refresh command that corresponds to the refresh skip area, the number of rows that are activated at the same time is reduced with respect to an area that is to be refreshed. For example, if the number of rows that are activated at the same time in a memory bank that does not have a refresh skip area is four (4), in the case of a memory bank having a refresh skip area, the number of rows that are activated at the same time in response to a refresh command corresponding to the refresh skip area occurs may become two (2).

Consequently, in the Case 2, the number of occurrences of refresh commands is not reduced and the number of times of refresh operations that are performed in the whole refresh time tREF is not reduced. The number of word lines that are activated at the same time for the area that is to be refreshed is reduced by 50%. A time t10 of the Case 2 is equal to a time t1 of the Reference and a time t11 of the Case 2 is equal to a time t2 of the Reference. In the Reference case, a refresh operation is performed four times and in the Case 2, four refresh operations are performed, but the number of word lines that are activated at the same time is reduced by a half.

In the case of FIG. 6, in an auto-refresh operation mode, the memory controller 100 generates as many refresh commands as would normally be generated for a memory system having no refresh skip areas. The memory controller 100 allocates refresh commands to an area that is to be refreshed that includes the number of refresh commands that correspond to a refresh skip area. Accordingly, the number of word lines that are activated at the same time is reduced. If the number of rows being activated at once is four, and 2500 refresh commands of 5000 total refresh commands are commands corresponding to the refresh skip area, if 2500 refresh operations are performed in the area that is to be refreshed, the number of rows that are activated at the same time in the same time period becomes two.

Consequently, power noises and power consumption may be reduced in the situation illustrated by FIG. 6 in which the number of occurrences of refresh commands is not changed, but the number of word lines that are activated at the same time for the area that is to be refreshed is reduced.

Figure 7:
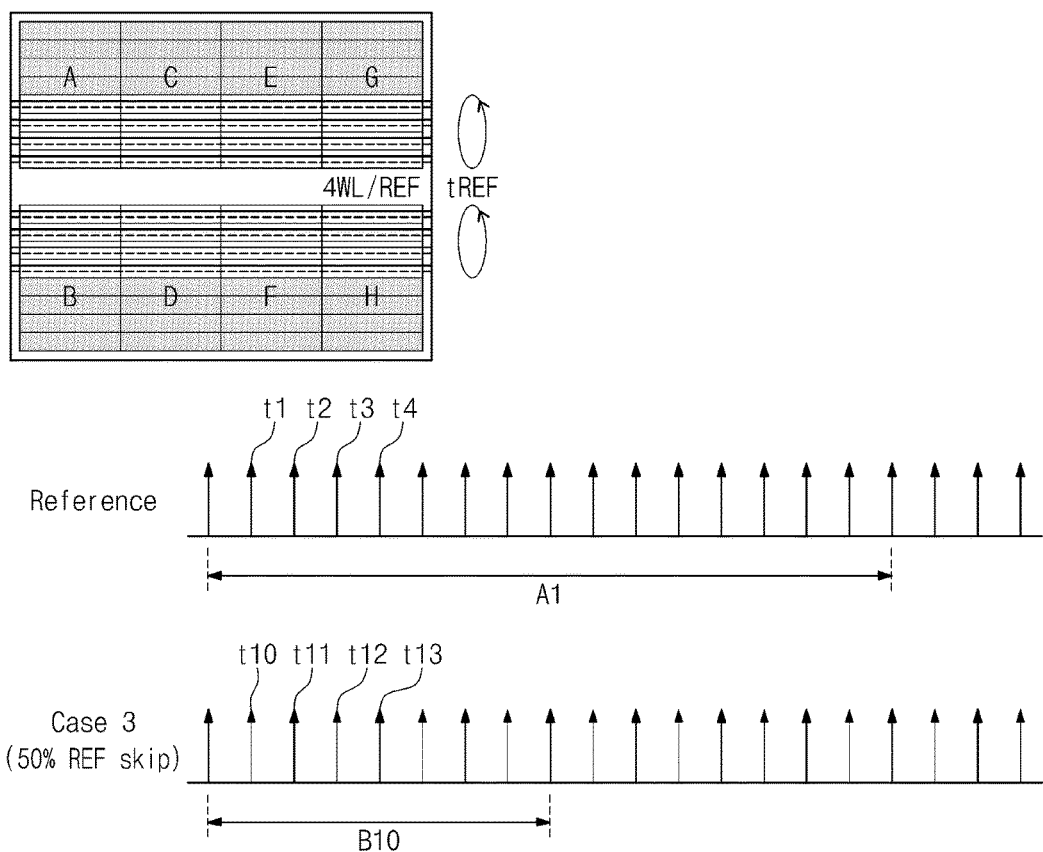
FIG. 7 is a drawing illustrating still another example associated with a refresh skip operation of the semiconductor memory device of FIG. 1 according to exemplary embodiments of the inventive concept.

FIG. 7 is a drawing illustrating still another example associated with a refresh skip operation of the semiconductor memory device of FIG. 1 according to exemplary embodiments of the inventive concept. As shown in FIG. 7, areas of the respective memory banks of the memory cell array that are shown in white represent areas that are to be refreshed, whereas areas of the respective memory banks of the memory cell array that are shown in gray represent areas that are refresh skip areas and are not to be refreshed.

Referring to FIG. 7, the refresh controller 220, when a refresh command corresponding to the refresh skip area is received or generated in a refresh control operation, can control the entire refresh operation period to be shorter than the whole refresh operation period in a situation in which there is no refresh skip area.

In FIG. 7, the number of refresh commands that are externally applied and the number of word lines that are activated at the same time in a Case 3 remains equal to the number of word lines that are activated in a Reference. The entire refresh operation period is reduced based on refresh commands that would be corresponding to the refresh skip area. The memory controller 100 maintains the number of refresh commands that are applied to a memory during a refresh period to be the same as would normally be generated for a memory system having no refresh skip areas. The memory controller 100 allocates as many refresh commands to a memory area that is to be refreshed as would be allocated to the number of refresh commands that would correspond to an address of the refresh skip area to thereby reduce an internal refresh period. In this case, the number of word lines being activated at the same time stays the same.

Thus, if reducing the entire refresh period to half using a command corresponding to the refresh skip area, a refresh operation per one row occurs twice in a memory area that is to be refreshed. For example, if 2500 refresh commands of 5000 refresh commands are commands corresponding to the refresh skip area, a refresh operation for the area that is to be refreshed occurs 2500 times each half time period in comparison to the Reference. Thus, in the case of FIG. 7, if the entire refresh period B10 of a Case 3 is half of the entire refresh period A1 of the Reference, a time t10 of the Case 3 is equal to a time t1 of the Reference, and a time t11 of the Case 3 is equal to a time t2 of the Reference. If in the case of the Reference, a refresh operation is performed four times, a refresh operation is performed four times in the Case 3, but a refresh operation per one row is performed twice with respect to the area that is to be refreshed. As depicted in FIG. 7, the lighter gray arrows shown for Case 3 (i.e., times t10, t12, and so on) represent the refresh operations that occur at twice the rate of the refresh operations of the Reference.

Figure 8:
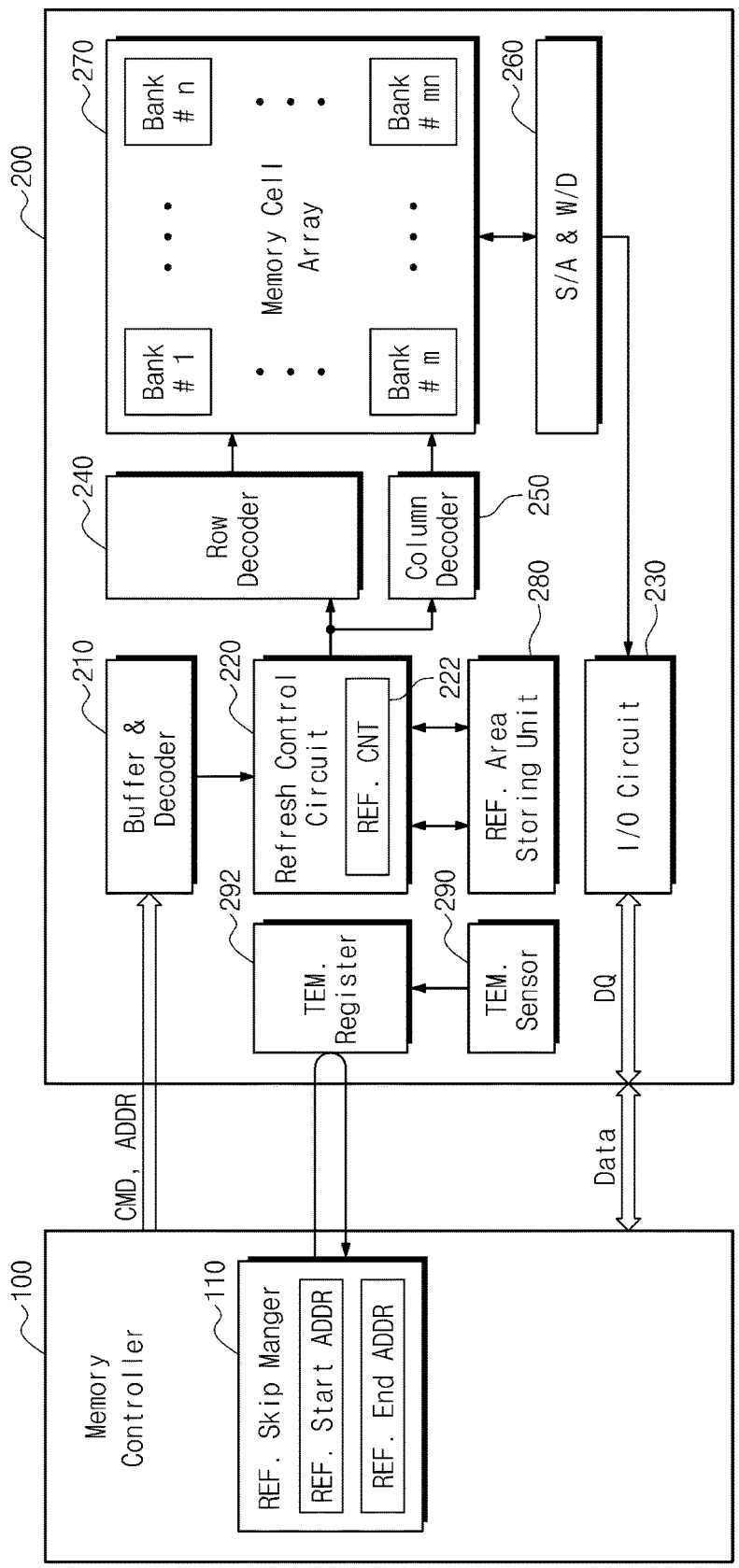
FIG. 8 is another illustrative block diagram of a memory system including a semiconductor memory device that manages a flexible refresh skip area according to exemplary embodiments of the inventive concept.

FIG. 8 is another illustrative block diagram of a memory system including a semiconductor memory device that manages a flexible refresh skip area according to exemplary embodiments of the inventive concept.

Referring to FIG. 8, a temperature sensor 290 that senses a temperature of the memory cell array 270 and a temperature register 292 that receives temperature-sensing information from the temperature sensor 290 are further added to the memory system of FIG. 1.

The refresh skip manager 110 of the memory controller 100 may access, or read, temperature-sensing information stored in the temperature register 292 in a polling method.

The refresh skip manager 110 may adjust a refresh period based on the temperature-sensing information read in the polling method besides generating a refresh beginning address and a refresh ending address in an auto-refresh operation mode. For example, in the case in which a temperature of the semiconductor memory device is relatively low, the refresh skip manager 110 can extend or lengthen a refresh period, and in the case in which a temperature of the semiconductor memory device is relatively high, the refresh skip manager 110 can reduce or shorten the refresh period. In the embodiments of the inventive concept, the temperature-sensing information is provided in the polling method, but the temperature-sensing information may be transmitted directly to the memory controller 100.

The number of occurrences of refresh commands may be adjusted according to the temperature-sensing information, and the number of word lines that are activated at the same time may be selectively and/or adaptively adjusted.

As a temperature of the memory cell array 270 becomes lower, a refresh period may be extended or lengthened, and thereby power consumption accompanied with a refresh in a relatively low temperature may be reduced.

Figure 9A:
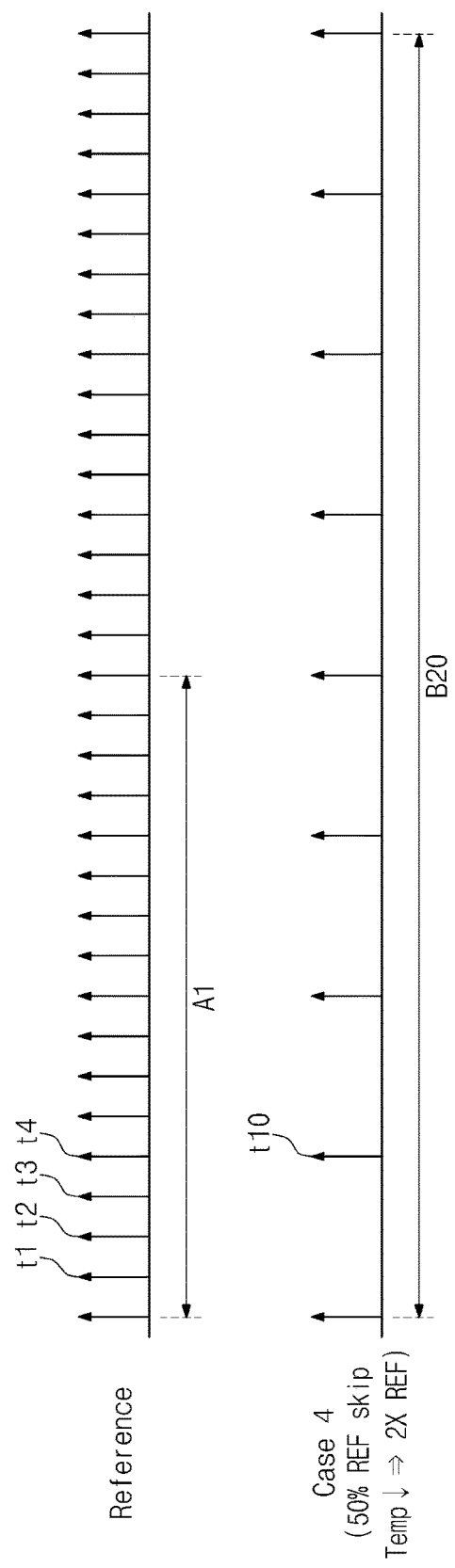
FIG. 9A is a drawing illustrating an example associated with a refresh skip operation of the semiconductor memory device of FIG. 8 according to exemplary embodiments of the inventive concept.
Figure 9B:
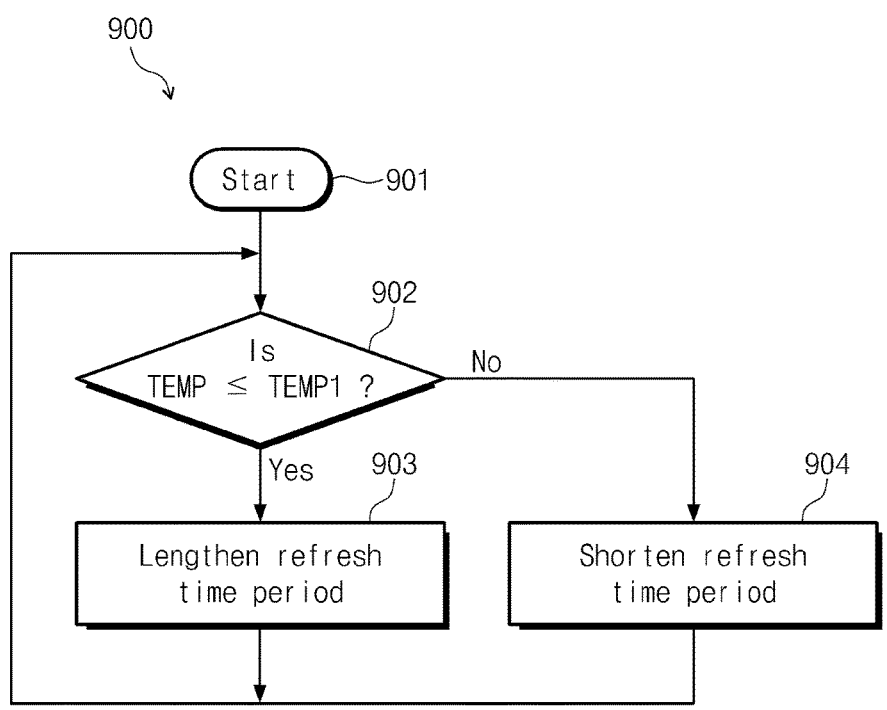
FIG. 9B is a refresh operation control flow diagram of the semiconductor memory device of FIG. 8 according to exemplary embodiments of the inventive concept.

FIG. 9A is a drawing illustrating an example associated with a refresh skip operation of the semiconductor memory device of FIG. 8 according to exemplary embodiments of the inventive concept. FIG. 9B is a refresh operation control flow diagram 900 of the semiconductor memory device of FIG. 8 according to exemplary embodiments of the inventive concept.

Referring to FIG. 9A, in a Case 4 in which a relatively low temperature is sensed, the entire refresh period B20 is twice as long as the entire refresh period A1 of a Reference.

A time t10 of the Case 4 is equal to a time t4 of the Reference. While a refresh operation is performed four times in the Reference, a refresh operation is performed once for an area that is to be refreshed in the Case 4.

In FIG. 9B, the process starts at operation 901 and flow continues to operation 902 wherein it is determined whether the temperature TEMP of the semiconductor memory device 200 is less than or equal to a predetermined temperature TEMP1. If so, flow continues to operation 903 where the time period of the refresh operation is lengthened. Flow returns to operation 902.

If, at operation 902, it was determined that the temperature TEMP of the semiconductor memory device 200 is greater than the predetermined temperature TEMP1, then flow continues to operation 904 where the time period of the refresh operation is shortened. Flow returns to operation 902. It should be understood that process 900 shown in FIG. 9B is generalized and process 900 could be refined to provide additional determinations of finer temperature gradations to control the time period of the refresh operation with greater resolution.

Figure 10:
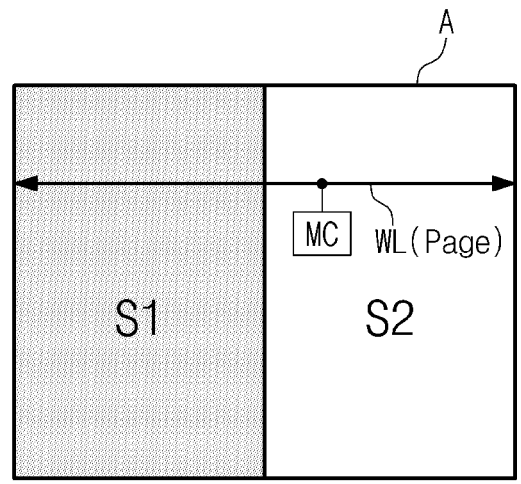
FIG. 10 is a drawing illustrating an example of designating a half bank of a half page drive as a refresh skip area according to a modified embodiment of the inventive concept.

FIG. 10 is a drawing illustrating an example of designating a half memory bank of a half page drive as a refresh skip area according to a modified embodiment of the inventive concept. As shown in FIG. 10, areas of the memory bank that are shown in white represent areas that are to be refreshed, whereas areas of the memory bank that are shown in gray represent areas that are refresh skip areas and are not to be refreshed.

Referring to FIG. 10, in the case of a memory bank A, a half bank S1 is set as a refresh skip area. If a half of one word line (one page), that is, a half page, is activated when a refresh operation is performed on one row, a refresh operation with respect to the half bank S1 is skipped and a refresh operation is performed with respect to a half bank S2. In this case, even in the case that an address selecting one page is applied, if making one half page disabled and the remaining half page is enabled by a selection of a left/right (or even/odd) page, only the half page S2 is refreshed. Accordingly, a refresh operation for memory cells that belong to the half bank S1 is skipped and power consumption in a refresh operation may be thereby reduced. The left/right (or even/odd) page may be selected using a separate signal or the MSB (most significant bit) signal of a column address signal and may be changed by a selection of a user or by a control of a memory controller.

Figure 11:
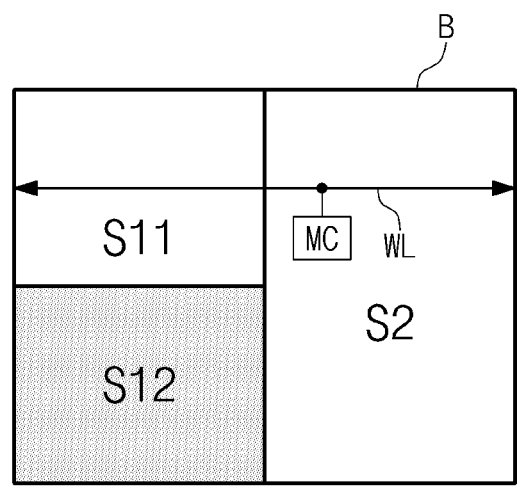
FIG. 11 is a drawing illustrating an example of designating a quarter bank of a half page drive as a refresh skip area according to a modified embodiment of the inventive concept.

FIG. 11 is a drawing illustrating an example of designating a quarter bank of a half page drive as a refresh skip area according to a modified embodiment of the inventive concept. As shown in FIG. 11, areas of the memory bank that are shown in white represent areas that are to be refreshed, whereas areas of the memory bank that are shown in gray represent areas that are refresh skip areas and are not to be refreshed.

Referring to FIG. 11, in the case of a memory bank B, a quarter bank S12 is set as a refresh skip area. If a half of one word line (one page), that is, a half page, is activated when a refresh operation is performed on one row, a refresh operation for the quarter bank S12 is skipped and a refresh operation is performed for a half bank S2 and a quarter bank S11. In this case, even in the case that an address selecting one page is applied, if selectively making one half page disabled and making the remaining half page enabled by a selection of a left/right (or even/odd) page, the half page S2 and the quarter bank S11 can be refreshed. Accordingly, a refresh operation with respect to memory cells that belong to the quarter bank S12 is skipped. For example, in the case that the number of memory cells connected to one word line is 1024, if a half page is activated, 512 memory cells connected to half of the selected word line are accessed. Thus, power consumption in a refresh operation may be reduced. The left/right (or even/odd) page may be selected using a separate signal or the MSB (most significant bit) signal of a column address signal and may be changed by a selection of a user or by a control of a memory controller.

Figure 12:
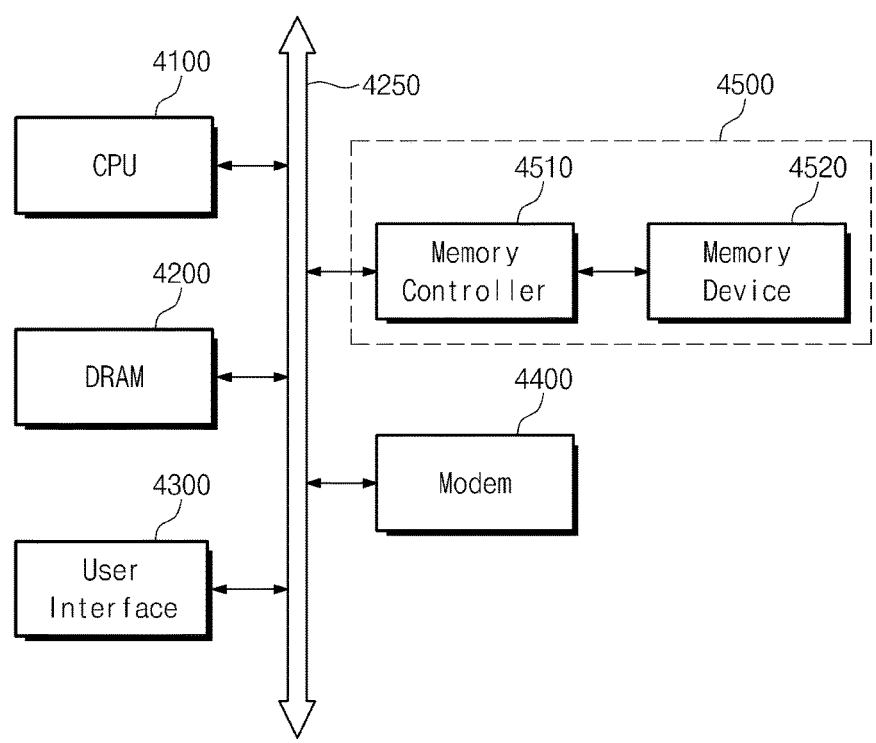
FIG. 12 is a block diagram illustrating an application example of the inventive concept applied to a computing device.

FIG. 12 is a block diagram illustrating an application example of the inventive concept applied to a computing device.

Referring to FIG. 12, a computing device may include a memory system 4500 including a DRAM 4520 and a memory controller 4510. The DRAM 4520 and the memory controller 4510 may respectively correspond to the memory device 200 and the memory controller 110 of FIG. 1. The computing device may include an information processing device or a computer. The computing device may include a modem 4400, a CPU 4100, a RAM 4200, a user interface 4300 that are electrically connected to a system bus 4250 besides the memory system 4500. The memory system 4500 may store data processed by the CPU 4100 or data input from the outside.

The computing device may be applied to a SSD (solid-state disk), a CIS (camera image processor), and an application chipset. The memory system 4500 may be constituted by a SSD and in this case, the computing device can store large amounts of data in the memory system 4500.

In the memory system 4500, the memory controller 4510 can apply a command, an address, data or a control signal to the DRAM 4520.

The CPU 4100 functions as a host and controls an overall operation of the computing device.

An interface between the CPU 4100 and the memory controller 4510 may include various types of protocols for a data exchange. The memory controller 4510 may be configured to communicate with the host or the outside through at least one of various types of interface protocols such as a USB (universal serial bus) protocol, a MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, a SCSI (small computer small interface) protocol, an ESDI (enhanced small disk interface) protocol, and an IDE (integrated drive electronics) protocol.

The computing device may be provided as one of various constituent elements of electronic devices such as a computer, an ultra mobile PC (UMPC), a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

As described through FIG. 1 or 8, since the DRAM 4520 manages a refresh skip area of which a size is selectively and/or adaptively changed by a memory bank, refresh performance and reliability may be improved and power consumption and power noise may be reduced.

Figure 13:
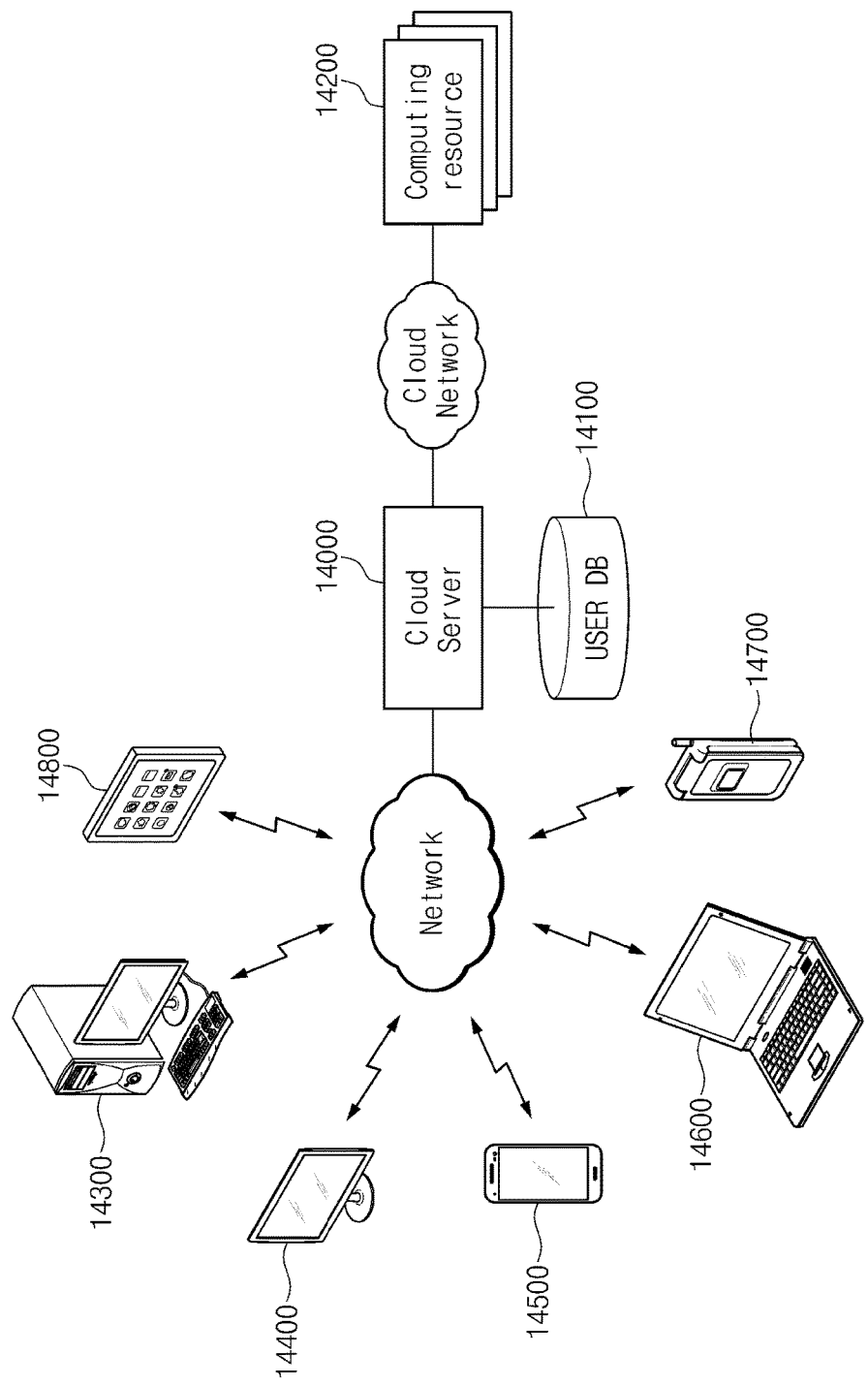
FIG. 13 is a block diagram illustrating an application example of the inventive concept applied to a cloud system.

FIG. 13 is a block diagram illustrating an application example of the inventive concept applied to a cloud system.

Referring to FIG. 13, a cloud system or a cloud computing system may be constituted by a cloud server 14000, a user DB 14100, a computing resource 14200, and a plurality of user terminals.

The cloud system can provide an on-demand outsourcing service of a computing resource through an information communication network like an internet according to a request of a user terminal. In a cloud-computing environment, a service provider can integrate computing resources of a data center that exist at different physical locations using a virtualization technology to provide a service necessary for a user.

A service user does not install computing resources, such as an application, a storage, an operating system OS, a security, etc. at a user terminal in order to use the resource, but that the service user can use a service of a virtual space generated through a virtualization technology as much as is necessary when necessary.

A user terminal of a specific service user connects to the cloud server 14000 through an information communication network including an internet and a mobile communication network. User terminals can receive a cloud computing service, in particular, a video play service from the cloud server 14000. In FIG. 13, a desk top PC 14300, a smart TV 14400, a smart phone 14500, a notebook 14600, a PMP (probable multimedia player) 14700 and a tablet PC 14800 are illustrated as the user terminal by example. A user terminal is not limited thereto and may be all electronic devices capable of an internet connection.

The cloud server 14000 can integrate multiple computing resources 14200 distributed in the cloud network to provide the integrated multiple computing resources 14200 to a user terminal. The multiple computing resources 14200 may include multiple data services and data uploaded from a user terminal. The cloud server 14000 integrates video data bases distributed in several places using a virtualization technology to provide a service required by the user terminal.

User information that joins a cloud computing service may be stored in the user DB 14100. The user information may include login information and personal information such as an address, a name, etc. The user information may include an index of a video. Here, the index may include a list of a video of which a play is completed, a list of a video which is currently playing, and stop time of a currently playing video.

Information about a video stored in the user DB 14100 may be shared among user devices.

In the case in which the smart phone 14500 receives a video data stream through the cloud server 14000, an operation of decoding a video data stream to generate a video is similar to an operation of a cell phone.

The cloud server 14000 may refer to a play history of a predetermined video service stored in the user DB 14100. For example, the cloud server 14000 receives a play request with respect to a video stored in the user DB 14100 from a user terminal. If the video was playing before, the cloud server 14000 can make a stream method different according to a selection of the user terminal.

For example, in the case in which the user terminal asks the video to be played from the beginning, the cloud server 14000 transmits a corresponding video to the user terminal from a first frame using a streaming transmission technology. In the case in which user terminal asks the video to be played in succession from the previous stop time, the cloud server 14000 transmits a corresponding video to the user terminal from a frame of the stop time using a streaming transmission technology.

In this case, the user terminal may include the aforementioned DRAM of the inventive concept and as described through FIG. 1 or 8, a refresh skip area of which a size is selectively and/or adaptively changed by a memory bank may be used as a frame buffer. That is, in the case in which partial memory areas of the DRAM are used as a frame buffer area, the areas may become a refresh skip area. Like this, if a refresh operation is skipped with respect to an area of a frame buffer not necessary for a refresh operation, system performance may be improved and power consumption may be reduced. In the case of reading data from a frame buffer area or writing data in the frame buffer area, data is interleaved between banks to maximize a bandwidth. Thus, the frame buffer area is allocated over all banks in a memory cell array. According to exemplary embodiments of the inventive concept, a refresh operation is skipped with respect to a frame buffer area which is variably and selectively and/or adaptively allocated to all the banks. Thus, operation performance and reliability of the cloud system may be improved, and power consumption and power noise may be reduced.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor memory device, comprising:
a memory cell array including a plurality of rows to store data;
a row decoder connected to the memory cell array;
a refresh area storage unit to store a beginning address and an end address of a memory area of the memory cell array that is to be refreshed, the memory area that is to be refreshed not including a refresh skip area of the memory cell array having a size that is selectively changed; and
a refresh control circuit connected to the row decoder, wherein the refresh control circuit controls a refresh operation for each row of the memory area that is to be refreshed and controls the refresh operation so that each row of the refresh skip area to not be refreshed.

2. The semiconductor memory device of claim 1, wherein the refresh control circuit controls the refresh operation so that the refresh operation is not received by the refresh skip area during the refresh operation.

3. The semiconductor memory device of claim 2, wherein the number of refresh commands generated for the memory area that is to be refreshed is based on a temperature of the semiconductor memory device.

4. The semiconductor memory device of claim 1, wherein the refresh control circuit controls a number of rows that are activated at the same time for the memory area that is to be refreshed is fewer than a number of rows that would be activated at the same time if there was no refresh skip area.

5. The semiconductor memory device of claim 4, wherein the number of rows that are activated is changed depending on a temperature of the semiconductor memory device.

6. The semiconductor memory device of claim 1, wherein the refresh control circuit controls an entire refresh operation period to be shorter than an entire refresh operation period if there was no refresh skip area.

7. The semiconductor memory device of claim 6, wherein a length of the entire refresh operation period is based on a temperature of the semiconductor memory device.

8. The semiconductor memory device of claim 1, wherein the refresh control circuit includes a refresh counter to count the refresh operation, and
wherein a minimum counting value of the refresh counter is set to a counting value corresponding to the beginning address of the memory that is to be refreshed, and a maximum counting value of the refresh counter is set to a counting value corresponding to the ending address of the memory that is to be refreshed.

9. The semiconductor memory device of claim 1, wherein the refresh control circuit controls the refresh control operation differently depending on whether the semiconductor memory device is in an auto-refresh operation mode or a self-refresh operation mode.

10. The semiconductor memory device of claim 1, wherein the refresh area storage unit comprises a mode register.

11. A semiconductor memory device, comprising:
a memory cell array including a plurality of rows to store data;
a row decoder connected to the memory cell array;
a refresh area storage unit to store a beginning address and an end address of a memory area of the memory cell array that is to be refreshed, the memory area that is to be refreshed not including a refresh skip area of the memory cell array having a size that is selectively changed; and
a refresh control circuit connected to the row decoder and the refresh area storage unit,
wherein the refresh skip area includes at least one row among the plurality of rows of the memory cell array that is used as at least a part of a frame buffer to store data during a time period that is shorter than a time period for the refresh operation.

12. The semiconductor memory device of claim 11, wherein the refresh skip area further includes rows of the memory cell array that do not store data.

13. The semiconductor memory device of claim 11, wherein the refresh area storage unit comprises a mode register that stores mode register set signals.

14. The semiconductor memory device of claim 11, wherein the beginning address and the ending address that are stored in the refresh area storage unit are provided by a memory controller.

15. The semiconductor memory device of claim 11, wherein the refresh control circuit includes a refresh counter to count a refresh operation,
wherein a minimum counting value of the refresh counter is set to a counting value corresponding to the beginning address of the memory area that is to be refreshed, and a maximum counting value of the refresh counter is set to a counting value corresponding to the ending address of the memory area that is to be refreshed, and
wherein the refresh control circuit controls a refresh operation for each row of the memory area that is to be refreshed and controls the refresh operation of each row of the refresh skip area to not be refreshed.

16. A semiconductor memory device, comprising:
a memory cell array to store data; and
a refresh control circuit coupled to the semiconductor memory device, the refresh control circuit to control a refresh operation of a memory area of the memory cell array that is to be refreshed, the memory area that is to be refreshed not including a refresh skip area of the memory cell array having a size that is selectively changeable based on data stored in the refresh skip area.

17. The semiconductor memory device of claim 16, wherein the data stored the refresh skip area comprises data for a frame buffer for a period of time that is less than a period of time of the refresh operation.

18. The semiconductor memory device of claim 17, wherein the refresh skip area contains no stored data.

19. The semiconductor memory device of claim 16, wherein the memory cell array comprises a plurality of rows to store the data, and
wherein the refresh control circuit controls a refresh operation for each row of the memory area that is to be refreshed and controls the refresh operation for each row of the refresh skip area to not be refreshed.

20. The semiconductor memory device of claim 19, wherein the refresh control circuit further controls an interval of time between a refresh operation of each row of the memory area that is to be refreshed based on a temperature of the semiconductor device.

* * * * *